United States Patent [19]
Pecone et al.

[11] Patent Number: 5,628,637
[45] Date of Patent: May 13, 1997

[54] COMPUTER SYSTEM SCSI ADAPTER CARD INCLUDING AN ADD-IN DAUGHTER BOARD PROVIDING AN EXTERNAL SCSI CONNECTOR FOR MODULAR AND UPGRADABLE SCSI BUS ROUTING OPTIONS

[75] Inventors: Victor Pecone; Jay Lory, both of Austin, Tex.

[73] Assignee: Dell USA, L.P., Austin, Tex.

[21] Appl. No.: 351,848

[22] Filed: Dec. 8, 1994

[51] Int. Cl.$^6$ ........................................ H01R 9/09
[52] U.S. Cl. ........................... 439/74; 361/686; 395/500
[58] Field of Search ..................... 439/74, 61; 361/686, 361/413; 395/500, 280

[56] References Cited

U.S. PATENT DOCUMENTS

| | | | |
|---|---|---|---|
| 5,099,394 | 3/1992 | Hood et al. | 439/74 |
| 5,121,295 | 6/1992 | Lam | 361/395 |
| 5,251,109 | 10/1993 | Baitz | 361/796 |
| 5,329,428 | 7/1994 | Block et al. | 439/74 |

*Primary Examiner*—Neil Abrams
*Assistant Examiner*—Eugene G. Byrd
*Attorney, Agent, or Firm*—Henry N. Garrana; Mark P. Kahler; Diana L. Roberts

[57] ABSTRACT

A SCSI adapter card which provides one or more internal SCSI channels and includes connectors for an optional daughter card which provides an external SCSI connector. The daughter card is a parallel mezzanine style daughter board which provides modular and upgradable SCSI bus routing options. In the preferred embodiment, the adapter card includes two SCSI controllers which provide two internal SCSI channels. The daughter board can include up to 2 SCSI controllers for additional SCSI channels. The daughter board can reroute one or more of the internal SCSI channels to the external connector according to various SCSI routing options or can include one or more SCSI controllers for additional SCSI channels. In one embodiment, the daughter board does not include a SCSI controller, but rather serves to reroute one or more of the internal SCSI controllers to the external connector. In a second embodiment, the daughter board includes one or more SCSI controllers which provide external SCSI channels in addition to the internal SCSI channels. The incorporation of the external SCSI connector on the daughter board eliminates the need for the base PWA add-in card to include the external SCSI connector and also eliminates the requirement for internal "umbilical" cables which burden mechanical limitations, decrease the reliability and complicate manufacturing and service.

14 Claims, 3 Drawing Sheets

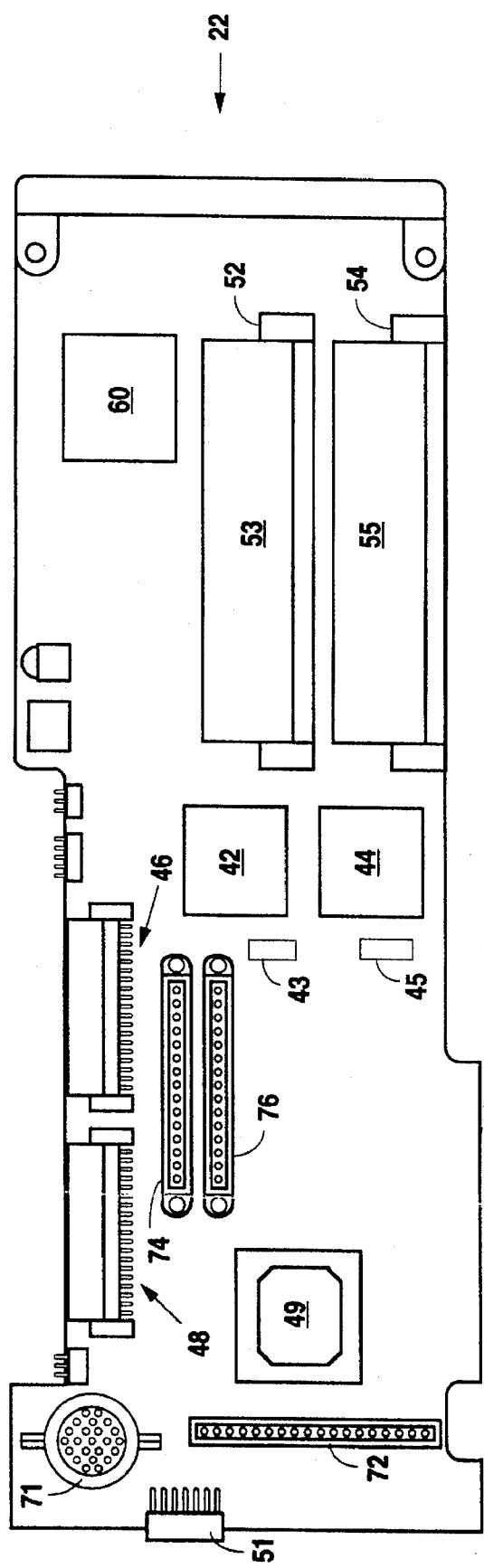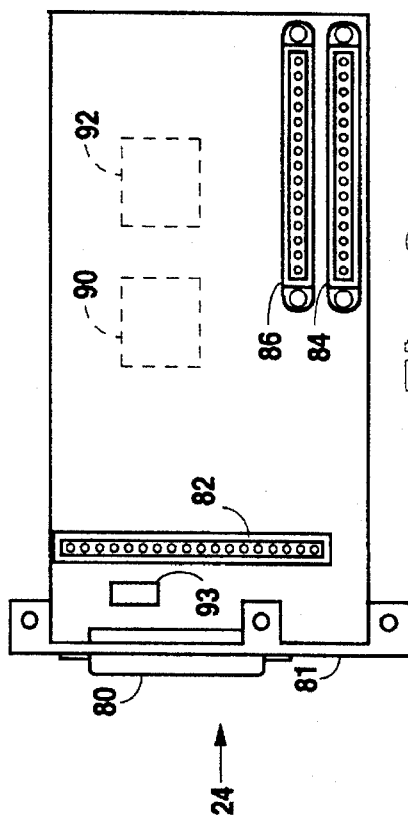

COMPUTER SYSTEM SCSI ADAPTER CARD INCLUDING AN ADD-IN DAUGHTER BOARD PROVIDING AN EXTERNAL SCSI CONNECTOR FOR MODULAR AND UPGRADABLE SCSI BUS ROUTING OPTIONS

FIELD OF THE INVENTION

The present invention relates to a SCSI adapter card in a computer system which can receive an add-in daughter board, wherein the add-in daughter board provides an external SCSI connector and either reroutes internal SCSI channels to the external connector or provides one or more additional SCSI channels for modular and upgradable SCSI bus routing options.

DESCRIPTION OF THE RELATED ART

In order to accommodate increasing requirements for data storage and data transfer capability, several peripheral device interface standards have been developed for data storage and transfer. These interface standards provide an interface between the host computer system and data storage devices which store data. Among these are the IDE, or integrated drive electronics interface, the ESDI, or enhanced small device interface, and the SCSI bus, or small computer systems interface bus.

The SCSI bus is a system level interface that essentially provides a complete expansion bus where peripherals such as data storage devices may be connected. The SCSI bus functions as a separate bus whereby SCSI devices can exchange data among themselves without the intervention of the host computer's microprocessor. In fact, SCSI devices can perform transfers across the SCSI bus while other transfers are occurring on the host computer's normal expansion bus. Various types of devices can be connected to the SCSI bus, including hard drives, tape drives, CD-ROMs, etc. Up to seven SCSI devices can be daisy-chained to one SCSI port on one "narrow" SCSI bus or "narrow" SCSI channel, or up to fifteen SCSI devices can be daisy-chained to one SCSI port on one "wide" SCSI bus or "wide" SCSI channel, and these devices function independently under the control of the host system through the SCSI adapter.

Modern computer systems which include a SCSI controller typically either incorporate the SCSI controller on the computer system motherboard, or provide the SCSI controller as an add-in card or adapter card to an expansion bus, such as the PCI bus, ISA bus, or EISA bus. In a computer system which includes an internal SCSI controller, many customers/users also desire that one or more SCSI ports be externally accessible for connection of external SCSI devices. This provides the customer/user with greater expansion capabilities, allowing the user to connect SCSI devices to the computer system without having to open the computer system unit case and without requiring the SCSI device to be internally mounted within the computer system with its accompanying cable.

However, including an external SCSI connector on an adapter card adds cost to the card. This extra cost is undesirable for users who do not need or do not want an external SCSI connector. However, those customers who desire an external SCSI connector may be unwilling to buy an adapter card which does not include an external connector. In addition, some users may buy an adapter card which does not include an external connector and later decide that an external connector is desired. Therefore, an adapter card is desired which provides one or more internal SCSI connectors and also allows for the addition of external SCSI connectors.

There are also several problems with providing an external SCSI connector for a typical PC adapter card. First, height or length restrictions placed on the adapter card, the available real estate on the board, and signal routing issues make it very difficult and/or prohibitive to add external SCSI connectors on the SCSI adapter add-in board PWA. This is especially so if more than one external SCSI connector option is necessary or desirable. Also, the defined mechanical I/O opening limits the size and/or number of external connectors regardless of whether these connectors are stacked or parallel.

Therefore, a new modular, upgradable SCSI adapter architecture is desired whereby a SCSI controller adapter or add-in card which includes one or more internal SCSI channels may be upgraded to provide one or more externally accessible SCSI channels. A SCSI adapter architecture is also desired which provides an external SCSI connector for an adapter card that overcomes board real estate and signal routing issues.

SUMMARY OF THE INVENTION

The present invention comprises a SCSI controller add-in card or adapter card which includes one or more internal SCSI connectors and corresponding channels. The adapter card does not include an external SCSI connector, but rather the adapter card includes connectors for an optional daughter card, wherein the daughter card includes an external SCSI connector that provides various external SCSI bus connection options. The daughter card is a parallel mezzanine style daughter board which provides modular and upgradable SCSI bus routing options according to the present invention. The daughter board external SCSI connector is mechanically compliant with the SCSI standard and allows external routing of either one or two SCSI channels.

In the preferred embodiment, the adapter card includes two SCSI controllers which provide two internal SCSI channels. The daughter board can optionally reroute one or more of the internal SCSI channels to the external connector. The daughter board can also include 1 or 2 SCSI controllers for additional SCSI channels provided over the external connector, as desired. In one embodiment, the daughter board does not include a SCSI controller, but rather serves only to reroute one or more of the internal SCSI channels to the external connector. In a second embodiment, the daughter board includes one or more SCSI controllers which provide one or more external SCSI channels to the external connector in addition to the internal SCSI channels. Therefore, the external SCSI connector daughter board provides modular and upgradable SCSI bus routing options.

The incorporation of the external SCSI connector on the daughter board also eliminates the need for the base PWA add-in card to include the external SCSI connector. As discussed in the background section, board height restrictions, limited board real estate, and signal routing issues generally make it prohibitive and/or impractical or undesirable to place an external SCSI connector on the main add-in board PWA. Therefore, the incorporation of the external SCSI connector on the daughter board eliminates the need for the base PWA add-in card to include this connector.

Therefore, the present invention comprises a SCSI controller architecture including an add-in SCSI controller card which can receive an optional daughter card. The daughter card provides an external SCSI connector and can either reroute internal channels to the external connector or provide up to two additional SCSI controllers, thus providing modular and upgradable SCSI bus routing options. The provision of an external SCSI connector eliminates the requirement for internal "umbilical" cables which burden mechanical limitations, decrease reliability, and complicate manufacturing and service. The present invention also minimizes SCSI bus stubs in routing on-board internal SCSI channels to the external connector.

BRIEF DESCRIPTION OF THE DRAWINGS

A better understanding of the present invention can be obtained when the following detailed description of the preferred embodiment is considered in conjunction with the following drawings, in which:

FIG. 1 illustrates a SCSI adapter card including connections for a daughter board;

FIG. 2 illustrates the SCSI daughter board;

DETAILED DESCRIPTION OF THE PREFERRED EMBODIMENT

Figure 3:
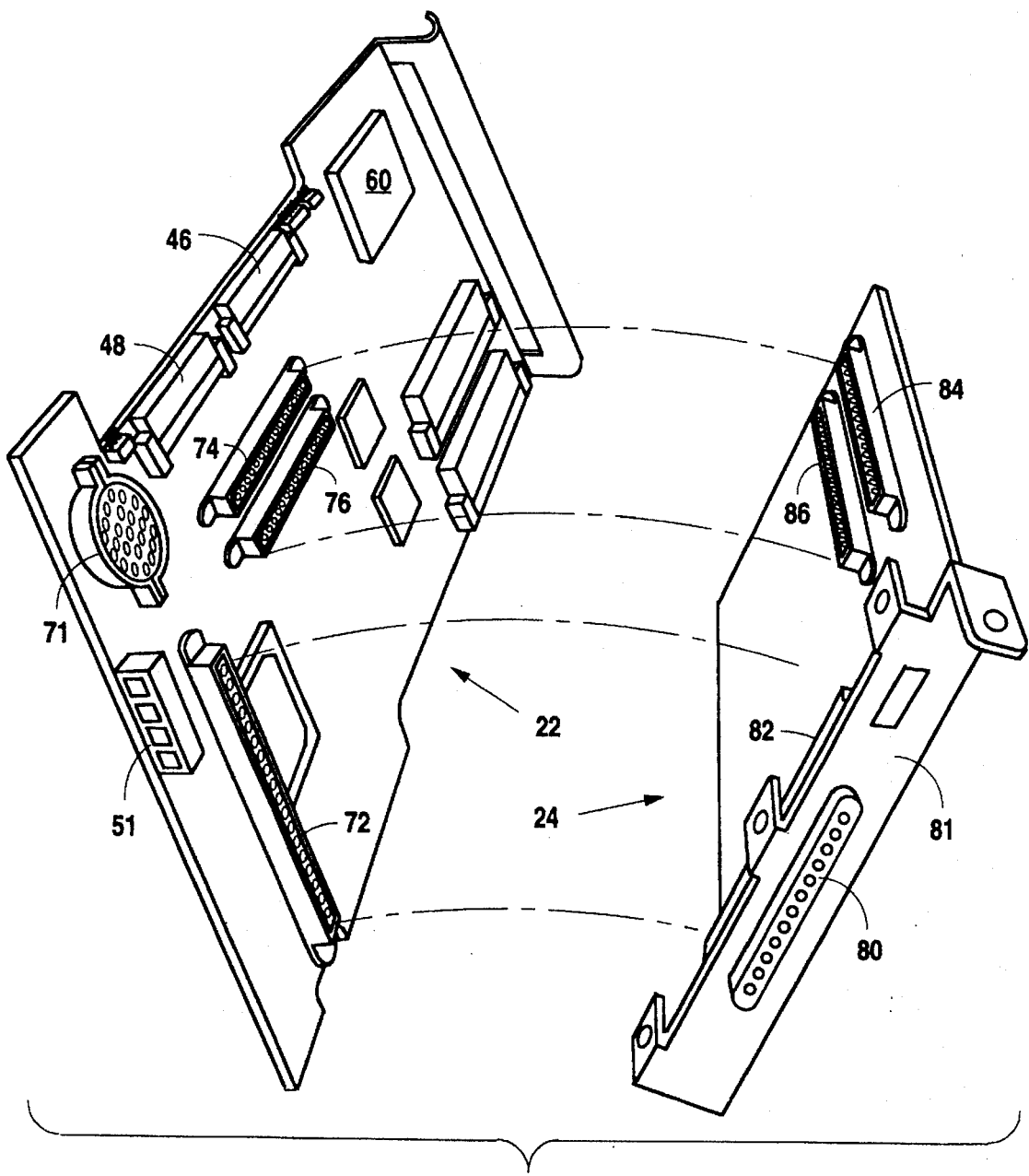
FIG. 3 illustrates the manner in which the daughter board connects to the adapter card.

Referring now to FIG. 1, a SCSI (small computer systems interface) adapter card 22 according to the preferred embodiment of the invention is shown. Although not explicitly shown in FIG. 1, the various elements comprised on the adapter card 22 are interconnected to perform various SCSI operations, as is well known in the art. As shown, the SCSI adapter card 22 preferably includes two SCSI controllers 42 and 44 and two corresponding SCSI connectors 46 and 48. It is noted that a greater or lesser number of controllers may be included, as desired. The SCSI controllers used according to the preferred embodiment of the invention are preferably PCI SCSI controllers manufactured by NCR Corporation. SCSI controller 42 preferably corresponds to SCSI connector 46 and SCSI controller 44 preferably corresponds to SCSI connector 48. The SCSI adapter card 22 also includes termination logic 43 and 45 associated with the SCSI controllers 42 and 44.

The SCSI adapter card 22 includes two SIMM sockets 52 and 54 which receive corresponding memory modules 53 and 55. The two SIMM memory modules 53 and 55 used in the adapter card 22 are preferably error correction coded (ECC) SIMMs produced by IBM Corporation. SCSI adapter card 22 includes a processor or CPU 60 which performs operations necessary to implement one or more RAID configurations as well as for controlling operations of the adapter card 22. In the preferred embodiment, the processor 60 is the PowerPC processor produced by Motorola. However, other processors may also be used. The adapter card 22 also preferably includes a PCI interface chip 49, a plurality of LEDs 51 for displaying the status of the board and a mounting hole 71 adapted for receiving a bracket.

The SCSI adapter card 20 preferably does not include an external connector. The SCSI adapter card 22 includes three daughter board connectors 72, 74 and 76 according to the preferred embodiment of the invention for receiving an optional add-in daughter board (24 FIG. 2) which includes an external connector. Signal pins on the SCSI connectors 46 and 48 connect to pins on the connectors 72, 74, and 76 to provide the two SCSI channels to the daughter board 24. The CPU 60 preferably stores one or more bits indicating whether the daughter board 24 is connected as well as bits indicating whether SCSI controllers are included on the daughter board 24, whether internal SCSI channels are routed externally, and whether SCSI devices are connected to the external connector on the daughter board 24.

Referring now to FIG. 2, the optional add-in daughter board 24 according to the preferred embodiment of the invention is shown. As shown, the daughter board 24 includes corresponding connectors 82, 84 and 86 which connect to the connectors 72, 74 and 76 on the SCSI adapter card 22. When the daughter board 24 is connected to the adapter card 22, the SCSI signals from connectors 46 and 48 are provided through the connectors 72, 74 and 76 on the adapter card 22 to the connectors 82, 84 and 86 on the daughter board 24. The daughter board 24 includes an external bracket 81 and an external connector 80 which is preferably mechanically compliant with the SCSI-3 standard. One or both of the SCSI channels from the adapter card 22 may be routed to the external connector 80, as desired. The SCSI daughter board 24 may include zero, one or two SCSI controllers, as desired, for various SCSI channel routing options. In the embodiment shown, the daughter board 24 includes SCSI controllers 90 and 92 shown in dotted lines, indicating these controllers are optional. When present, the SCSI controllers 90 and 92 each provide a SCSI channel over the external connector 80. The daughter board 24 also includes a means 93, preferably a pull-up resistor, for determining if one or more SCSI devices are connected to the external connector 80.

Figure 4:
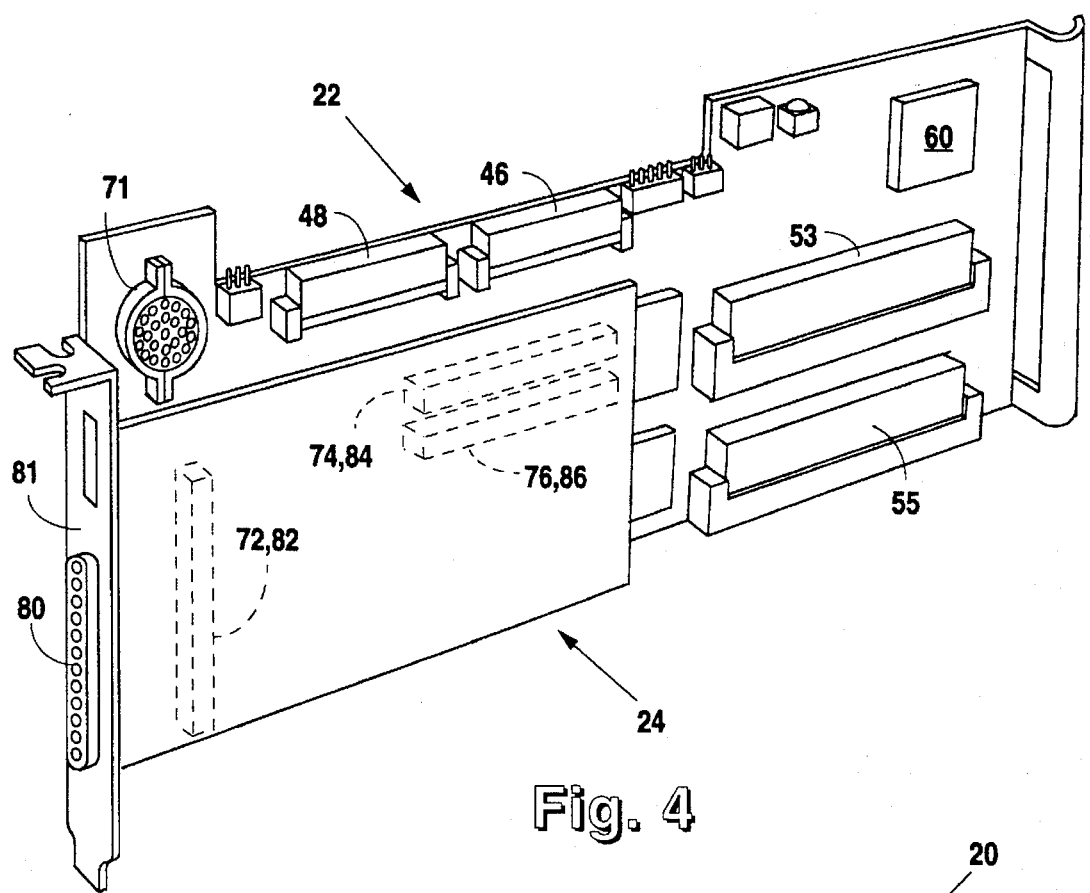
FIG. 4 illustrates the SCSI adapter card with accompanying daughter card shown separately from a computer system.
Figure 5:
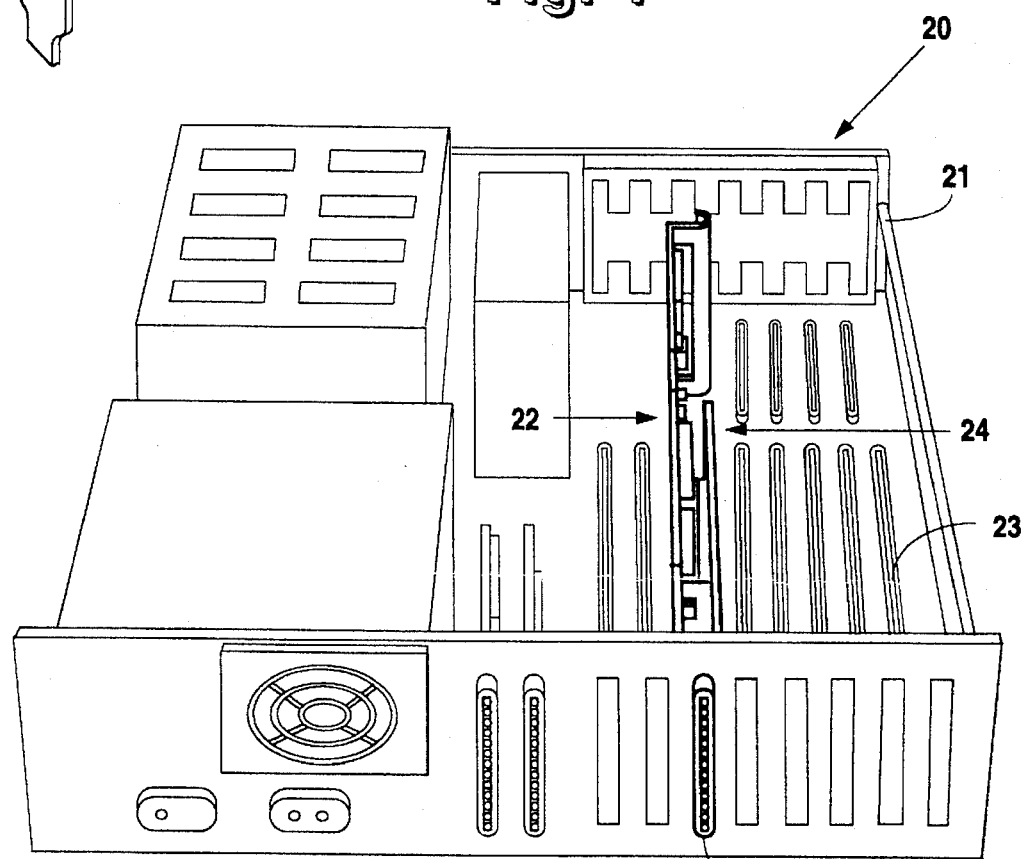
FIG. 5 illustrates a computer system incorporating the SCSI adapter and accompanying daughter board which includes an external SCSI connector according to the present invention.

FIG. 3 illustrates the manner in which the daughter board 24 connects to the SCSI adapter card 22. As shown, connectors 82, 84 and 86 on the daughter board 24 mate with corresponding connectors 72, 74 and 76 on the SCSI adapter card 22. When the daughter board 24 is connected to the adapter card 22, as shown in FIG. 4, the combined card, referred to herein as an expansion device, includes one external bracket 81 and one external SCSI connector 80. The combined card or expansion device also occupies only one computer expansion slot, as shown in FIG. 5. As mentioned above and described further below, the daughter board 24 can reroute internal SCSI channels to the external connector 80, or the daughter board 24 may include one or more SCSI controllers 90 and 92 to provide one or more additional SCSI channels out through the connector 80.

Referring now to FIG. 5, a computer system 20 incorporating the SCSI adapter 22 with accompanying daughter board 24 according to the preferred embodiment of the invention is shown. The computer system 20 comprises a system unit 21 which includes various standard components, including a CPU, memory, and expansion bus including expansion slots 23. The computer system 20 also preferably includes one or more SCSI devices comprised within the system unit 21, such as a hard drive, CD-ROM, tape drive, etc. As shown, the SCSI adapter 22 and daughter board 24 occupy only one expansion slot 23 in the computer system 20, preferably a PCI slot. The daughter board 24 provides the external SCSI connector 80 according to the present invention. When the adapter card 22 is inserted into the computer system 20 without the daughter board 24, the adapter card 22 does not provide an external connector out of the back of the system unit 21.

The daughter board 24 may be configured according to various embodiments. In all daughter board embodiments, the signals corresponding to the two internal SCSI channels are provided to the daughter board connectors 72, 74, and 76 on the adapter card 22 to the connectors 82, 84, and 86 on the daughter board 24. In one embodiment the daughter card 24 does not include any SCSI controllers, and the daughter board 24 acts to reroute one or both of the internal SCSI channels to the external connector 80. In an embodiment where the daughter board 24 reroutes only one of the internal SCSI channels to the external connector 80, the signals for the respective channel that is rerouted are provided by the daughter board 24 directly to the external connector 80. The SCSI signals for the channel that is not rerouted are also provided through the respective connectors on the adapter card 72, 74 and 76 to the daughter board connectors 82, 84, and 86. However, these signals terminate on the daughter board 24 and are not provided to the external connector 80.

In this embodiment, the daughter board 24 provides signals to the CPU 60 on the adapter card 22 indicating that the daughter board 24 is connected and which respective internal SCSI channel is rerouted externally. The daughter board 24 also indicates whether a SCSI cable and accompanying devices are connected to the external connector 80. It is noted that where SCSI signals are routed to the external connector 80, but no SCSI devices are connected to the external connector 80, this results in signal stubs at the end of the SCSI daisy chain for the internal SCSI channel. However, these stubs are relatively short and do not present problems to the internal SCSI channel.

In an embodiment where the daughter board 24 is configured to reroute both of the internal SCSI channels from corresponding SCSI connectors 46 and 48 to the external connector 80, the SCSI signals for both internal channels provided from the adapter card 22 to the daughter board 24 are provided through switching logic (not shown) on the daughter board 24 to the external connector 80. A special Y cable (also not shown) is used to multiplex the two SCSI channels on the one SCSI-3 compliant connector 80. For more information on the use of the switching logic and Y cable to incorporate two SCSI channels on a single standard SCSI-3 connector, please see related co-pending application (DC-00679) Ser. No. 08/352,254 titled "SCSI Connector and Y Cable Configuration Which Selectively Provides Single or Dual SCSI Channels on a Single Standard Connector," filed Dec. 8, 1994, which is hereby incorporated by reference as though fully set forth herein. In this embodiment, the daughter board 24 provides signals to the CPU 60 on the adapter card 22 indicating that the daughter board 24 is connected and that both internal channels are routed externally. The daughter board 24 also indicates whether a single channel cable or dual channel "Y" cable is connected. For more information on how the daughter board 24 indicates whether a single channel cable or dual channel "Y" cable is connected to the connector 80, please see the above-referenced application.

In another embodiment, the daughter board 24 includes one SCSI controller 90. In this embodiment, the two internal SCSI channels are preferably not rerouted externally and remain internal to the computer system 20 through SCSI connectors 46 and 48. The SCSI controller 90 on the daughter board 24 provides a third external SCSI channel out through the SCSI connector 80. In this embodiment, since only one SCSI channel is being provided out through the SCSI connector 80, the switching logic and special Y connector referenced above are not required.

In yet another embodiment, which is the embodiment shown in FIG. 2, the daughter board 24 includes two SCSI controllers 90 and 92 which provide two external SCSI channels through connector 80. In this embodiment, the two internal SCSI channels remain internal to the computer system 20 as represented by SCSI connectors 46 and 48, and the SCSI controllers 90 and 92 provide two additional SCSI channels that are provided through the external SCSI connector 80. Therefore, this embodiment provides a total of four SCSI channels. In this embodiment, the switching logic and special Y connector described above are used. The switching logic provides the SCSI signals corresponding to the two channels to the external connector 80, and the Y connector splits out the two external SCSI channels into separate cables. For more information on the switching logic and Y cable, please see the above-referenced application.

Therefore, the present invention provides various SCSI bus routing options. The chart below illustrates these various options and includes headings for the number and type of SCSI channels, i.e., internal channels, external channels, or internal/external channels (internal channels routed externally), whether the daughter board is required, whether the daughter board has zero, one or two SCSI controllers, and whether the special Y cable is necessary.

| Internal and External Channels | Daughter Board | Daughter Board Controllers | Switching Logic and Y Cable |
| --- | --- | --- | --- |
| Two internal channels | No | N/A | No |
| One internal, one internal/external | Yes | 0 | No |
| Two internal/external channels | Yes | 0 | Yes |
| Two internal channels, one external channel | Yes | 1 | No |
| Two internal, two external | Yes | 2 | Yes |

As shown in the chart, when the daughter board 24 is not connected to the adapter card 22, the adapter 22 simply comprises two internal SCSI channels, and the switching logic and Y cable are unnecessary. Also, the adapter card 22 by itself does not include an external connector. When the daughter board 24 is present and does not include any on-board SCSI controllers, the daughter board 24 may be configured to reroute either one or both of the internal SCSI channels to the external connector 80. In the former case where the daughter board 24 reroutes one of the internal channels to the external connector 80, which is option 2 in the chart, then the combined adapter card or expansion device comprises one internal SCSI channel which is not rerouted and one internal/external SCSI channel, i.e., an internal SCSI channel that has been rerouted externally. With regard to the internal/external SCSI channel, SCSI devices may be connected either to the external connector 80 or the respective internal SCSI connector. In the case where the daughter board 24 does not include any on-board SCSI controllers and serves to reroute both of the internal channels to the external connector 80, which is option 3 in the chart, then the expansion device, i.e., the combined adapter card 22 with daughter board 24, includes two internal/external channels. In other words, both of the internal channels are rerouted to the external connector 80. Thus, for each channel, SCSI devices may be connected to either the external connector 80 or the respective internal connector 46 or 48. In this embodiment, the daughter board 24 includes the switching logic and the special Y cable is necessary to multiplex the two SCSI channels on the single, standard external connector 80.

In an embodiment where the daughter board 24 is included and comprises one SCSI controller 90, then the combined adapter card 22 with daughter board 24 includes the two internal channels provided by connectors 46 and 48 and one external channel provided by the SCSI controller 90 on the daughter board 24. In this embodiment, the switching logic and Y cable are not necessary on the daughter board 24. It is noted here that in the embodiment where the daughter board includes one SCSI controller, it is also possible to reroute one of the internal channels to the external connector 80 to provide one internal channel, one internal/external channel, and one external channel. In this embodiment, the switching logic and Y cable would be necessary. In the final embodiment listed on the chart above, the daughter board 24 is included and comprises two SCSI controllers 90 and 92. In this embodiment, the combined adapter card 22 with accompanying daughter board 24 includes two internal SCSI channels provided by internal connectors 46 and 48 and two external SCSI channels provided by the connector 80. In this embodiment, the daughter board 24 includes the switching logic and the special Y cable is necessary.

In embodiments where the daughter board 24 includes one or more SCSI controllers 90 and 92, the control signals on the SCSI adapter card 22 which are provided to the SCSI controllers 42 and 44 on the adapter card 22 and which are not SCSI signals are provided through the connectors 72, 74 and 76 and 82, 84 and 86 to the respective SCSI controllers 90 and/or 92 on the daughter board 24. Therefore, when the daughter board 24 includes one or more SCSI controllers 90 and 92, the control signals from the adapter card 22 which are not SCSI signals are provided to the new SCSI controllers 90 and 92 which are added by the daughter board 24.

As mentioned above, the adapter card 22 includes termination logic 43 and 45 associated with each controller 42 and 44, respectively, for terminating the SCSI bus at the respective controller when the controller is at the end of the respective SCSI daisy chain. The terminator devices 43 and 45 connect to all the data and control lines, i.e., all the non-ground lines, of the SCSI channel which needs to be terminated. As is well known, devices at each end of a SCSI daisy chain must be properly terminated for proper electrical operation.

As described above, the present invention allows one or more of the internal SCSI channels represented by controllers 42 and 44 and connectors 46 and 48 to be routed to the external connector 80 provided by the add-in daughter board 24. In this instance, the respective SCSI channel that is rerouted externally cannot be terminated at the controller if one or more SCSI devices are connected to the external connector 80, because in this instance the controller will be in the middle of the SCSI daisy chain and thus will not be at the end of the daisy chain. Therefore, when the daughter board 24 reroutes one or more internal SCSI channels externally, the daughter board 24 provides the SCSI adapter card 22 one or more signals through the daughter board connectors 72, 74, and 76 which indicate the internal SCSI channels that have been rerouted to the external connector 80. The daughter board 24 also provides signals indicating whether any SCSI devices are connected to the respective SCSI channel that has been rerouted externally. If an external SCSI channel has been rerouted externally and one or more SCSI devices are connected to the channel, then the CPU 60 disables the termination logic for that controller and prevents the respective SCSI channel from being terminated at the respective controller. If a respective internal SCSI channel is not rerouted externally and/or no SCSI devices are connected to the external connector 80 for that respective SCSI channel, then the termination logic remains enabled to terminate the respective SCSI channel at the controller because, in this instance, the respective SCSI controller will be at the end of the SCSI daisy chain.

Therefore, when the daughter card 24 is passive and does not include any SCSI controllers 90 or 92, and one or both of the internal channels are routed externally, the daughter card 24 directs the CPU 60 on the adapter card 22 to turn off the terminator to the respective controller(s) on the adapter card 22 whose channel has been routed externally when a cable is inserted into the external connector 80. This is necessary because the controller is in the middle of a chain of SCSI devices and hence cannot be terminated. The daughter board 24 includes a means 93, preferably a pull-up resistor, for monitoring the connector 80 and determining when a SCSI device is connected to the external connector 80. In the preferred embodiment, one of the ground signal pins of the external SCSI connector 80 is "stolen" and used for this purpose. The ground signal pin in the connector 80 is tied to the pull-up resistor 93 on the daughter board 24. The signal from the pull-up resistor 93 passes through the daughter board connectors to the adapter card 22 as a status of whether the controller should be terminated or not. When nothing is connected to the connector 80, i.e., when no SCSI device is connected to the connector 80, then the pull-up resistor 93 pulls the line up. This signal is provided to the adapter card 22 and directs the CPU 60 to turn on the terminator for the respective channel. When a cable with an accompanying device is inserted into the daughter board external connector 80, whether it be the special Y cable or a standard single channel connector, the ground pulls the pull-up resistor 93 low for the respective channel(s) where a device is connected. As a result, the logic 93 detects that a cable is present and directs the CPU 60 on the adapter card 22 to turn off the termination to the controller for the respective channel(s) that are rerouted.

Therefore, the daughter board 24 provides various information up through the connectors 82, 84, and 86 to the CPU 60 on the adapter card 22 regarding which internal SCSI channels have been rerouted to the external connector 80, if any. The daughter board 24 also provides information regarding whether a SCSI cable and SCSI devices are connected to the external connector 80. The CPU 60 on the adapter card 22 uses this information to determine whether to enable or disable the termination logic 43 and 45 on the adapter card 22, as discussed above.

In an embodiment where the daughter board 24 includes one or two SCSI controllers 90 and 92 and no internal channels are routed externally, the respective SCSI channels must be terminated at their controller. Thus pull-up resistors 93 to sense whether the channels should be terminated at their respective controller are unnecessary.

Therefore, the present invention comprises a SCSI adapter card which can receive an optional daughter card. The daughter card provides an external SCSI connector and can either reroute internal channels to the external connector or provide up to two additional SCSI controllers and hence two additional channels, thus providing modular and upgradable SCSI bus routing options. The provision of an external SCSI connector eliminates the requirement for internal "umbilical" cables which burden mechanical limitations, decrease reliability, and complicate manufacturing and service. The present invention also minimizes SCSI bus stubs in routing on-board internal SCSI channels to the external connector.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A SCSI expansion device for use in a computer system which provides modular and upgradable SCSI bus routing options, comprising:

a SCSI adapter card adapted for insertion into an expansion slot of a computer system, including:
one or more SCSI controllers providing signals for one or more SCSI channels;
one or more internal SCSI connectors coupled to said one or more SCSI controllers, wherein said one or more internal SCSI connectors are each adapted for coupling to one or more SCSI devices in the computer system;
one or more daughter board connectors for receiving a daughter board, and;
termination logic coupled to said one or more SCSI controllers; and a daughter board including connectors for coupling to said one or more daughter board connectors on said SCSI adapter card, wherein said daughter board includes an SCSI connector, wherein said external SCSI connector is adapted to be externally accessible from the computer system when said daughter board is connected to said SCSI adapter card and said SCSI adapter card is inserted into the expansion slot of the computer system, wherein said external SCSI connector is adapted for coupling to one or more external SCSI devices;

wherein at least one of said one or more SCSI controllers are connected to at least one of said one or more daughter board connectors on said adapter card to provide signals corresponding to at least one of said one or more SCSI channels to said daughter board; and wherein said daughter board routes signals corresponding to said at least one of said one or more SCSI channels from said at least one of said one or more SCSI controllers to said external SCSI connector; and, wherein said SCSI adapter card disables said termination logic to said at least one of said one or more SCSI controllers when said daughter board routes signals corresponding to said at least one of said one or more SCSI channels from said at least one of said one or more SCSI controllers to said external SCSI connector.

2. The SCSI expansion device of claim 1, wherein said daughter board includes means for determining if one or more SCSI devices are connected to said external SCSI connector and provides a signal to said SCSI adapter card indicative thereof; and wherein said SCSI adapter card disables said termination logic only if said indicating signal indicates that one or more SCSI devices are connected to said external connector.

3. A SCSI expansion device for use in a computer system which provides modular and upgradable SCSI bus routing options, comprising:

a SCSI adapter card adapted for insertion into an expansion slot of a computer system, including:
one or more SCSI controllers providing signals for one or more SCSI channels;
one or more internal SCSI connectors coupled to said one or more SCSI controllers, wherein said one or more internal SCSI connectors are each adapted for coupling to one or more SCSI devices in the computer system; and
one or more daughter board connectors for receiving a daughter board; and, a daughter board including connectors adapted for coupling to said one or more daughter board connectors on said SCSI adapter card, wherein said daughter board includes an external SCSI connector, wherein said external SCSI connector is adapted to be externally accessible from the computer system when said daughter board is connected to said SCSI adapter card and said SCSI adapter card is inserted into the expansion slot of the computer system, wherein said external SCSI connector is adapted for coupling to one or more external SCSI devices;

wherein at least one of said one or more SCSI controllers are connected to at least one of said one or more daughter board connectors on said adapter card to provide signals corresponding to at least one of said one or more SCSI channels to said daughter board; and wherein said daughter board routes signals corresponding to said at least one of said one or more SCSI channels from said at least one of said one or more SCSI controllers to said external SCSI connector; and, wherein said SCSI adapter card includes two SCSI controllers and two internal SCSI connectors, wherein said daughter board routes signals from said two SCSI controllers to said external SCSI connector.

4. The SCSI expansion device of claims 1 or 3, wherein said one or more external SCSI channels are in addition to said one or more channels provided by said one or more SCSI controllers on said SCSI adapter card.

5. The SCSI expansion device of claims 1 or 3, wherein said daughter board provides a signal to said SCSI adapter card indicating said daughter board is present when said daughter board is coupled to said SCSI adapter card.

6. The SCSI expansion device of claims 1 or 3, wherein said daughter board is connected to said SCSI adapter card in a parallel mezzanine fashion.

7. A computer system including a SCSI adapter card which can receive an optional daughter card to provide modular and upgradable SCSI bus routing options, comprising:

a system unit;

a bus comprised within said system unit including one or more expansion slots for receiving adapter cards;

a SCSI adapter card comprised within said system unit and coupled to an expansion slot on said bus, wherein said SCSI adapter card includes one or more SCSI controllers providing signals for one or more SCSI channels and one or more internal SCSI connectors coupled to said one or more SCSI controllers, wherein said SCSI adapter card also includes one or more daughter board connectors for receiving a daughter board;

one or more SCSI devices comprised within said system unit coupled to at least one of said one or more internal SCSI connectors;

said SCSI adapter card including termination logic coupled to said one or more SCSI controllers; and a daughter board coupled to said one or more daughter board connectors on said SCSI adapter card, wherein said daughter board includes an external SCSI connector which is externally accessible from said system unit, wherein said external SCSI connector is adapted for coupling to one or more external SCSI devices;

wherein said SCSI adapter card disables said termination logic to said at least one of said one or more SCSI controllers when said daughter board routes signals corresponding to said at least one of said one or more SCSI channels from said at least one of said one or more SCSI controllers to said external SCSI connector.

8. A computer system including a SCSI adapter card which can receive an optional daughter card to provide modular and upgradable SCSI bus routing options, comprising:

a system unit;

a bus comprised within said system unit including one or more expansion slots for receiving adapter cards;

a SCSI adapter card comprised within said system unit and coupled to an expansion slot on said bust wherein said SCSI adapter card includes one or more SCSI controllers providing signals for one or more SCSI channels and one or more internal SCSI connectors coupled to said one or more SCSI controllers, wherein said SCSI adapter card also includes one or more daughter board connectors for receiving a daughter board;

one or more SCSI devices comprised within said system unit coupled to at least one of said one or more internal SCSI connectors; and a daughter board coupled to said one or more daughter board connectors on said SCSI adapter card, wherein said daughter board includes an external SCSI connector which is externally accessible from said system unit, wherein said external SCSI connector is adapted for coupling to one or more external SCSI devices, said daughter board including means for determining if one or more SCSI devices are connected to said external SCSI connector and provides a signal to said SCSI adapter card indicative thereof; and wherein said SCSI adapter card disables said termination logic only if said indicating signal indicates that one or more SCSI devices are connected to said external connector.

9. A computer system including a SCSI adapter card which can receive an optional daughter card to provide modular and upgradable SCSI bus routing options, comprising:

a system unit;

a bus comprised within said system unit including one or more expansion slots for receiving adapter cards;

a SCSI adapter card comprised within said system unit and coupled to an expansion slot on said bus, wherein said SCSI adapter card includes one or more SCSI controllers providing signals for one or more SCSI channels and one or more internal SCSI connectors coupled to said one or more SCSI controllers, wherein said SCSI adapter card also includes one or more daughter board connectors for receiving a daughter board;

one or more SCSI devices comprised within said system unit coupled to at least one of said one or more internal SCSI connectors; and a daughter board coupled to said one or more daughter board connectors on said SCSI adapter card, wherein said daughter board includes an external SCSI connector which is externally accessible from said system unit, wherein said external SCSI connector is adapted for coupling to one or more external SCSI devices;

wherein at least one of said one or more SCSI controllers are connected to at least one of said one or more daughter board connectors on said adapter card to provide signals corresponding to at least one of said one or more SCSI channels to said daughter board;

wherein said daughter board routes signals corresponding to said at least one of said one or more SCSI channels from said at least one of said one or more SCSI controllers to said external SCSI connector; and wherein said SCSI adapter card includes two SCSI controllers and two internal SCSI connectors, wherein said daughter board routes signals from one of said two internal SCSI connectors to said external SCSI connector.

10. A computer system including a SCSI adapter card which can receive an optional daughter card to provide modular and upgradable SCSI bus routing options, comprising:

a system unit;

a bus comprised within said system unit including one or more expansion slots for receiving adapter cards;

a SCSI adapter card comprised within said system unit and coupled to an expansion slot on said bus, wherein said SCSI adapter card includes one or more SCSI controllers providing signals for one or more SCSI channels and one or more internal SCSI connectors coupled to said one or more SCSI controllers, wherein said SCSI adapter card also includes one or more daughter board connectors for receiving a daughter board;

one or more SCSI devices comprised within said system unit coupled to at least one of said one or more internal SCSI connectors; and a daughter board coupled to said one or more daughter board connectors on said SCSI adapter card, wherein said daughter board includes an external SCSI connector which is externally accessible from said system unit, wherein said external SCSI connector is adapted for coupling to one or more external SCSI devices;

wherein at least one of said one or more SCSI controllers are connected to at least one of said one or more daughter board connectors on said adapter card to provide signals corresponding to at least one of said one or more SCSI channels to said daughter board;

wherein said daughter board routes signals corresponding to said at least one of said one or more SCSI channels from said at least one of said one or more SCSI controllers to said external SCSI connector; and wherein said SCSI adapter card includes two SCSI controllers and two internal SCSI connectors, wherein said daughter board routes signals from said two SCSI controllers to said external SCSI connector.

11. The computer system of claims 7, 9 or 10, wherein said daughter board is removably coupled to said one or more daughter board connectors on said SCSI adapter card.

12. The computer system of claims 7, 9 or 10, wherein said one or more external SCSI channels are in addition to said one or more channels provided by said one or more SCSI controllers on said SCSI adapter card.

13. The computer system of claims 7, 9 or 10, wherein said daughter board provides a signal to said SCSI adapter card indicating said daughter board is present.

14. The computer system of claims 7, 9 or 10, wherein said daughter board is connected to said SCSI adapter card in a parallel mezzanine style.

* * * * *